United States Patent [19]
Pawlowski

[11] Patent Number: 5,973,989
[45] Date of Patent: Oct. 26, 1999

[54] METHOD AND APPARATUS FOR TRANSMITTING AND RECEIVING DATA AT BOTH THE RISING EDGE AND THE FALLING EDGE OF A CLOCK SIGNAL

[75] Inventor: J. Thomas Pawlowski, Boise, Id.

[73] Assignee: Micron Technology, Inc., Boise, Id.

[21] Appl. No.: 08/918,568

[22] Filed: Aug. 22, 1997

[51] Int. Cl.$^6$ .................................................. G11C 8/00
[52] U.S. Cl. ...................................... 365/233; 365/189.05
[58] Field of Search .............................. 365/233, 189.05, 365/49; 711/118, 140

[56] References Cited

U.S. PATENT DOCUMENTS

| | | | |
|---|---|---|---|
| 5,226,011 | 7/1993 | Yanagisawa | 365/189.05 |
| 5,390,149 | 2/1995 | Vogley et al. | 365/189.01 |
| 5,416,739 | 5/1995 | Wong | 365/189.01 |
| 5,726,950 | 3/1998 | Okamoto | 365/233 |

*Primary Examiner*—Son Mai
*Attorney, Agent, or Firm*—Kirkpatrick & Lockhart LLP

[57] ABSTRACT

A synchronous memory circuit having a memory array and a control circuit. The control circuit is responsive to a clock signal having a rising edge and a falling edge. The control circuit generates control signals for accessing the memory array at the rising edge and the falling edge of the clock signal. A read circuit is responsive to the control signals and generates read data signals indicative of data stored in the memory array. A write circuit is responsive to the control signals and stores data in the memory array.

30 Claims, 9 Drawing Sheets

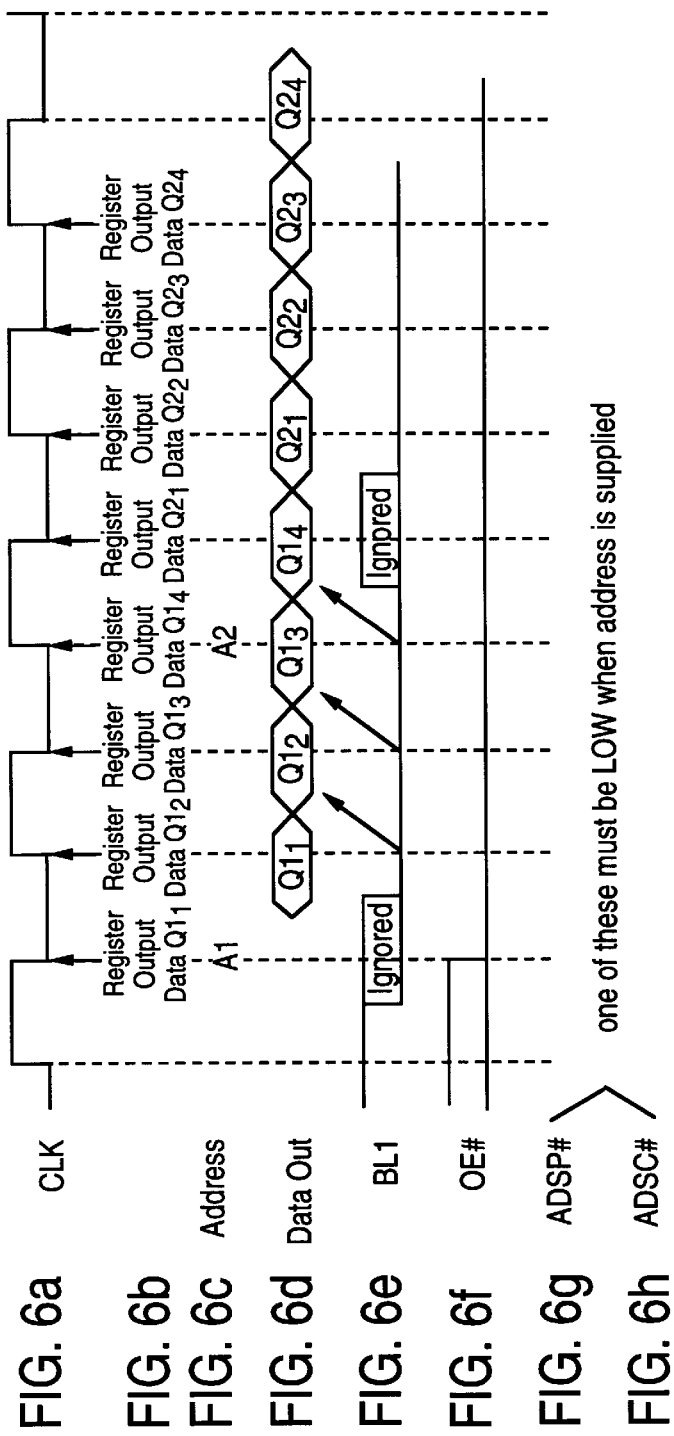

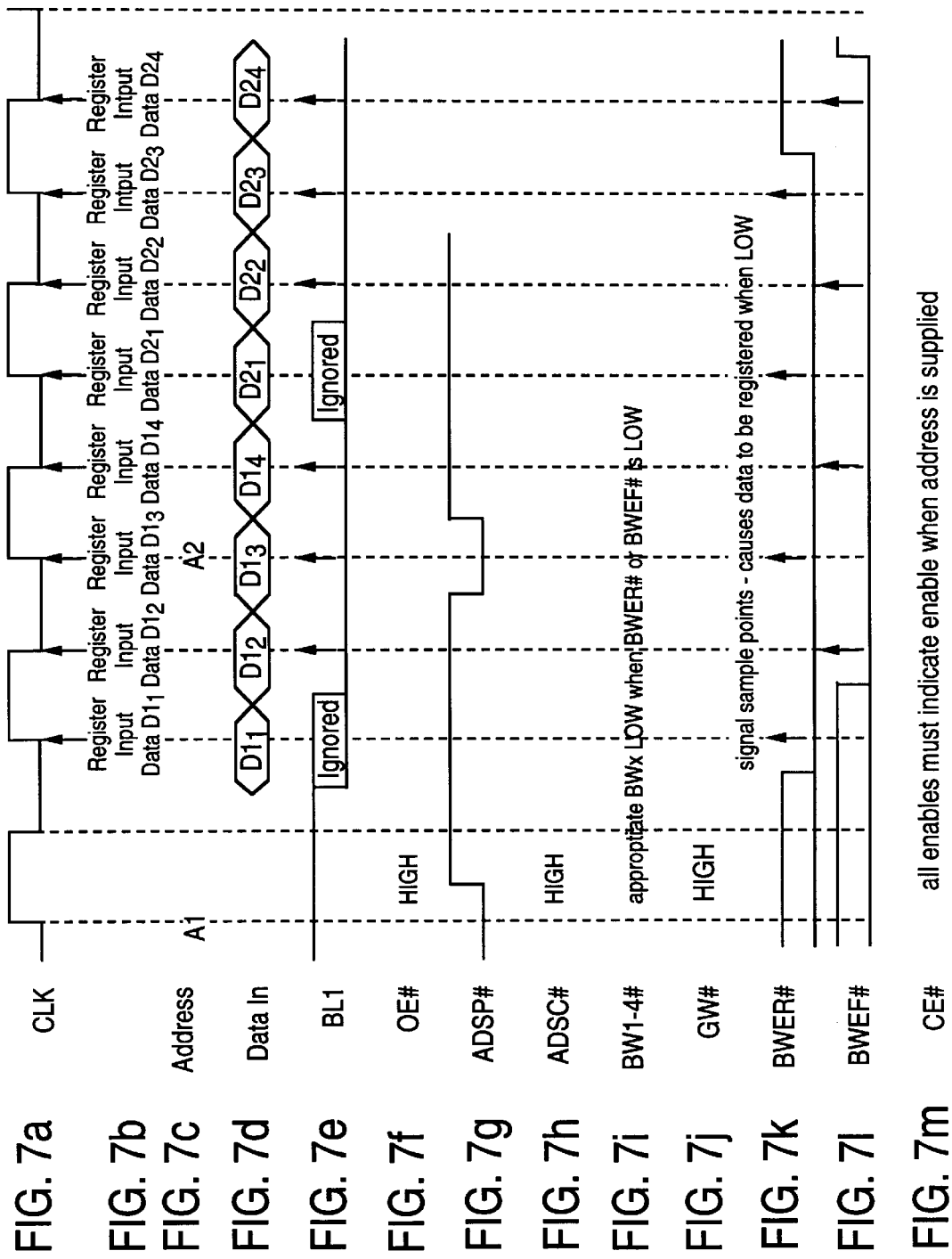

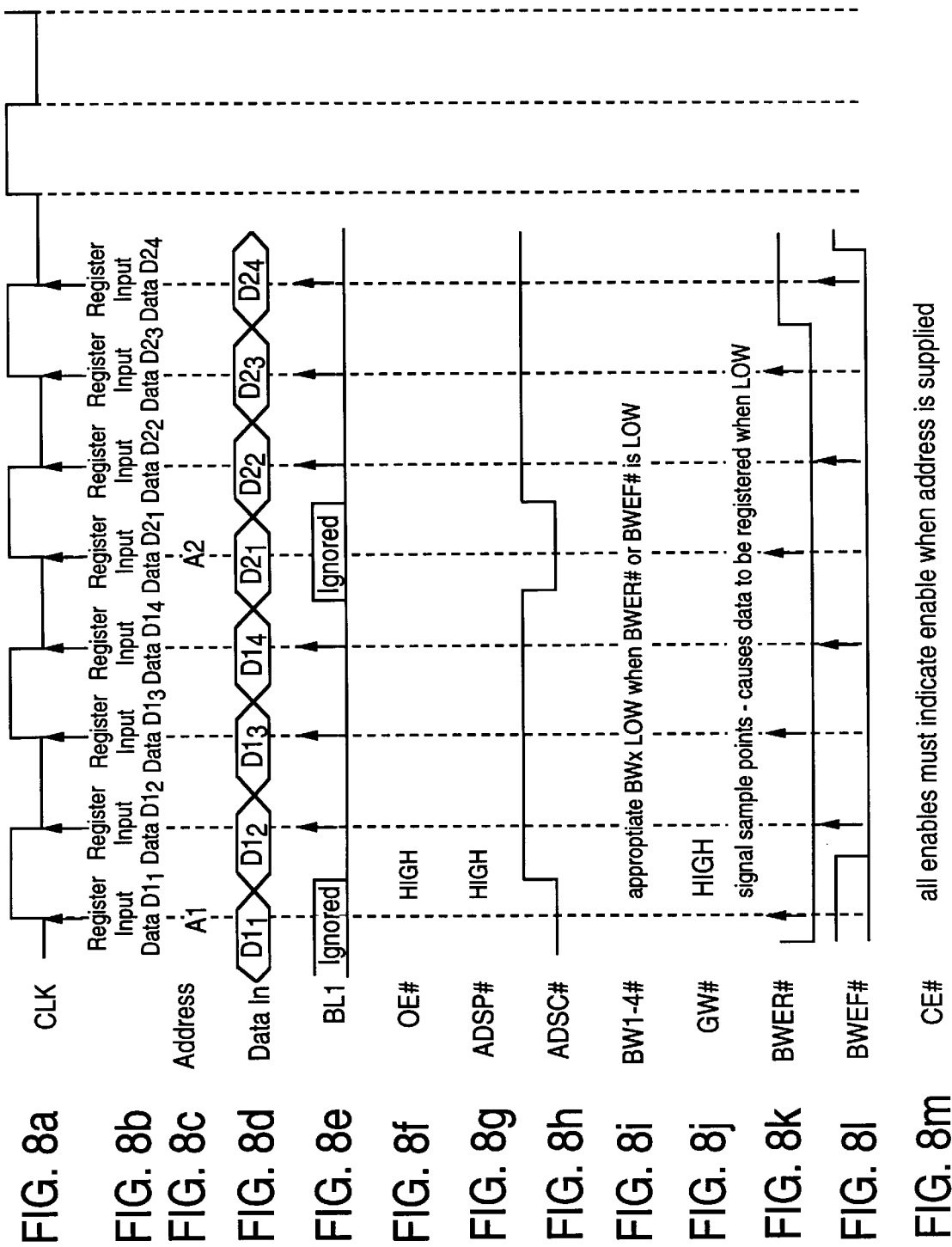

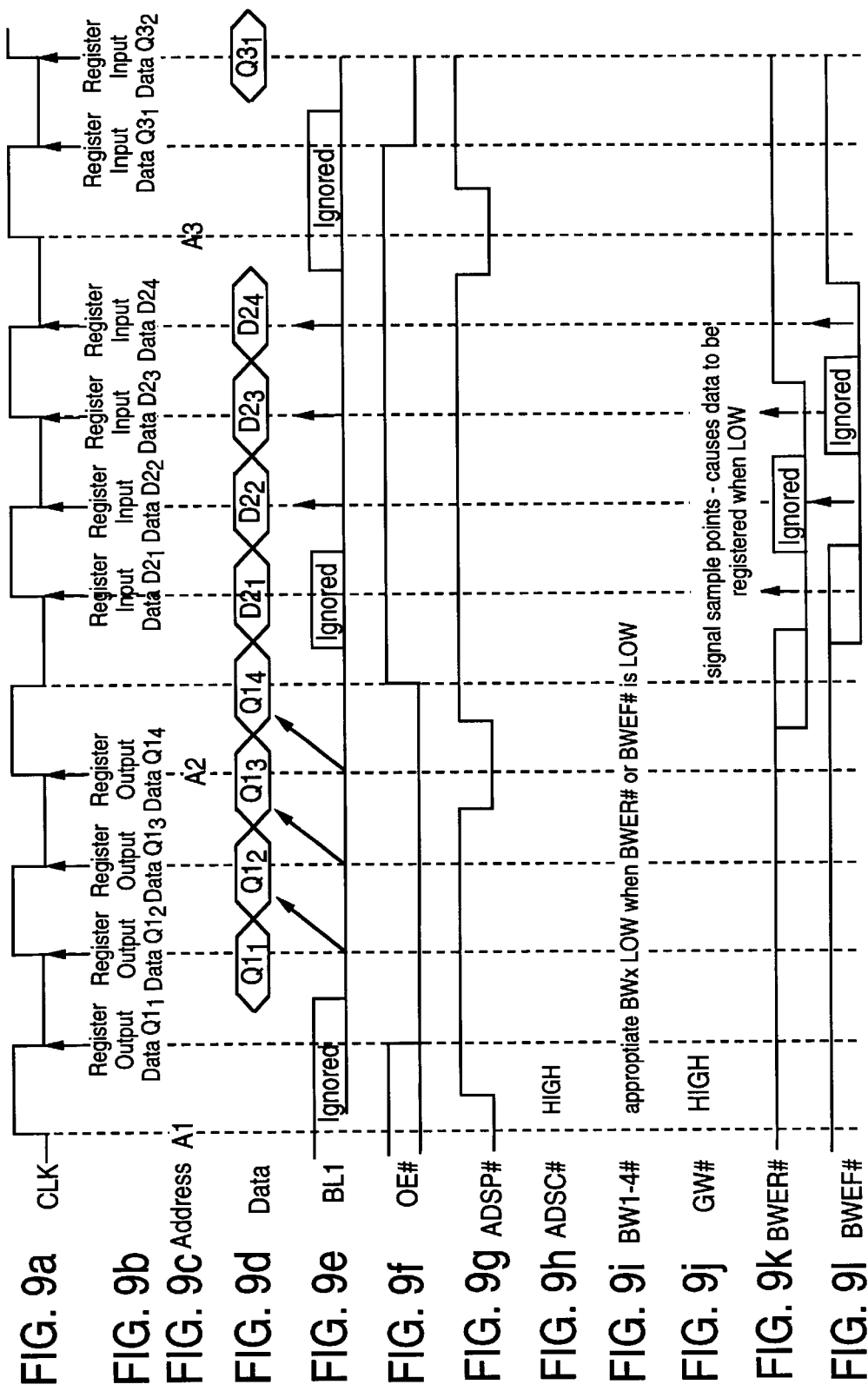

METHOD AND APPARATUS FOR TRANSMITTING AND RECEIVING DATA AT BOTH THE RISING EDGE AND THE FALLING EDGE OF A CLOCK SIGNAL

CROSS REFERENCE TO RELATED APPLICATIONS

Not Applicable.

STATEMENT REGARDING FEDERALLY SPONSORED RESEARCH AND DEVELOPMENT

Not Applicable.

BACKGROUND OF THE INVENTION

1. Field of the Invention

The present invention is directed generally to a method and apparatus for transmitting and receiving data at a frequency greater than a clock signal and, more particularly, to a memory circuit and associated method for transmitting and receiving data at both the rising edge and the falling edge of the clock signal.

2. Description of the Background

Synchronous memory devices, such as static random access memory (SRAM) and dynamic random access memory (DRAM), are triggered by an externally supplied clock signal. Typically, access to the memory device is triggered once per clock cycle, at either the rising edge or the falling edge of the clock signal.

Architecture for a typical memory system includes not only the memory circuit itself, such as SRAM and DRAM, but also a processor for controlling the system and additional circuits for supporting operation of the system. For example, in a cache memory system the support circuits include a cache control logic and a TAG device for supporting the operation of the memory circuit. Regardless of the particular memory system, the prior art method of operating synchronous memory circuits is problematic when, for example, one component of the system, such as the memory device, cannot operate as quickly as another component of the system, such as the processor. For example, it may be desirable to run a Pentium® processor (manufactured by Intel, Corp., Santa Clara, Calif.) at 133 Megahertz, but it requires expensive memory circuits and associated logic that can also operate at 133 Megahertz. Significant monetary savings can be realized if slower, less expensive memory devices and associated logic, such as that which operates at 66 Megahertz, can be used with a 133 Megahertz processor.

Thus, the need exists for a memory system that can utilize a high speed processor with less expensive, lower speed memory devices and associated logic while still transferring data at the high speed of the processor. Furthermore, the need exists for a memory circuit for use in such a system to transmit data at twice the frequency of the clock signal.

BRIEF SUMMARY OF THE INVENTION

The present invention is directed to a synchronous memory circuit having a memory array and a control circuit responsive to a clock signal having a rising edge and a falling edge. The control circuit generates control signals for accessing the memory array at the rising edge and the falling edge of the clock signal. A read circuit is responsive to the control signals and generates data signals indicative of data stored in the memory array. A write circuit is responsive to the control signals and stores data in the memory array.

The present invention also includes a method of reading data from a memory circuit. The method includes the steps of generating a clock signal having first and second consecutive edges, selecting a first memory location within a memory array, sensing a first data signal indicative of data stored at the first memory location within the memory array, latching the first data signal at the first edge of the clock signal, providing the latched first data signal at a terminal, selecting a second memory location within the memory array, sensing a second data signal indicative of data stored at the second memory location within the memory array, latching the second data signal at the second edge of the clock signal, and providing the latched second data signal at the terminal.

Furthermore, the present invention includes a method of storing data to a memory circuit. The method includes the steps of generating a clock signal having first and second consecutive edges, latching a first data signal at the first edge of the clock signal, storing the first data signal in a memory array, latching a second data signal at the second edge of the clock signal, and storing the second data signal in the memory array.

The present invention solves problems encountered when it is desirable to transmit data at a high frequency between a processor operating at the high frequency and memory circuits operating at a lower frequency. Those and other advantages and benefits of the present invention will become apparent from the description of the preferred embodiments hereinbelow.

BRIEF DESCRIPTION OF THE SEVERAL VIEWS OF THE DRAWINGS

For the present invention to be clearly understood and readily practiced, the present invention will be described in conjunction with the following figures, wherein:

FIGS. 6a through 6m are timing diagrams illustrating signals within the memory system during back to back read cycles;

FIGS. 7a through 7m are timing diagrams illustrating signals within the memory system during back to back write cycles initiated by the processor;

FIGS. 8a through 8m are timing diagrams illustrating signals within the memory system during back to back write cycles initiated by the cache control logic; and FIGS. 9a through 9m are timing diagrams illustrating signals within the memory system during a read-write cycle.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical memory system. Those of ordinary skill in the art will recognize that other elements are desirable and/or required in order to implement the present invention. However, because such elements are well known in the art, and because they do not facilitate a better understanding of the present invention, a discussion of such elements is not provided herein. Finally, a signal followed by a pound sign ("#1") indicates that the signal is a logical complement of a signal having the same designation but without the pound sign, e.g., CE2# is the logical complement of CE2. Similarly, input and output terminal designations that are followed by a pound sign are active low inputs and outputs, e.g., chip enable terminal CE2# is active low, meaning that the chip is enabled when a low logic state signal is present at terminal CE2#, assuming that all other conditions for enablement are also met.

Figure 1:
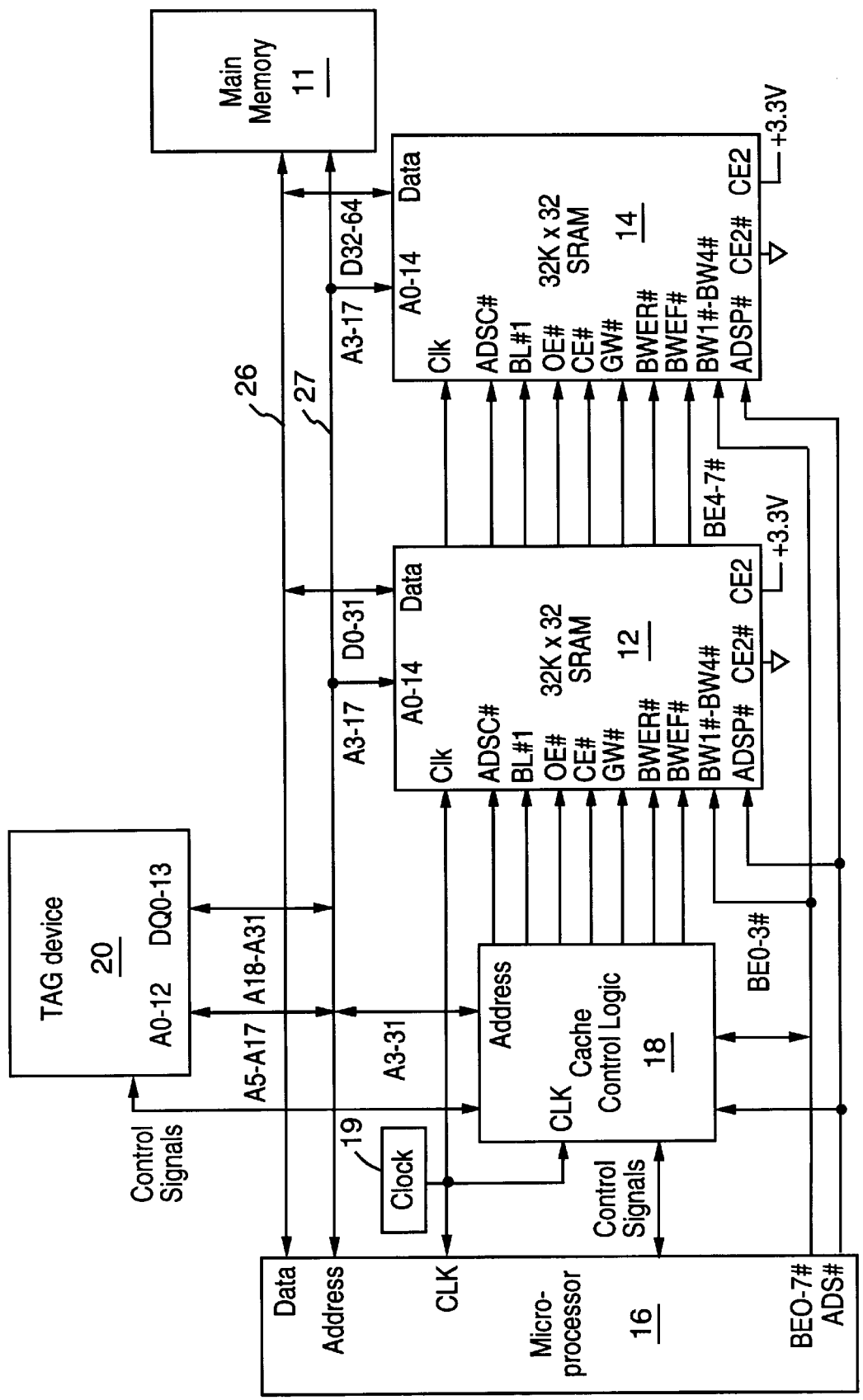
FIG. 1 is a high-level block diagram illustrating a memory system, including two memory circuits, constructed in accordance with the present invention.

FIG. 1 is a high level block diagram illustrating a memory system 10 constructed in accordance with the present invention. The memory system 10 preferably includes a main memory 11, a first memory circuit 12 and a second memory circuit 14. The first and second memory circuits 12, 14 form a cache memory and are organized in a depth-expanded stack, as is generally known in the art. Although the present invention may be used in any type of memory system or circuit, it is preferably embodied in cache memory because the present invention increases data transfer rate, which is generally more important with cache memory than with other types of memory. Furthermore, the memory circuits 12, 14 are preferably synchronous static random access memories (SRAM), although other embodiments, such as synchronous dynamic random access memories (DRAM), may also be used with the present invention. The memory circuits 12, 14 may be fabricated using any one of many different technologies, including silicon-on-insulator technology, silicon-on-sapphire technology, and thin film transistor technology. The preferred embodiment of the present invention is fabricated on a silicon substrate using a conventional doping technology.

The memory circuits 12, 14 each receive three chip enable signals at chip enable terminals CE#, CE2#, and CE2. Chip enable terminal CE# is used to disable the memory circuits 12, 14 in order to prevent read and write operations, prevent new addresses from being accessed within the memory circuits 12, 14, and to block address interrupt signals, discussed in more detail below. The CE# terminal may also be used to selectively disable the memory circuits 12, 14, for example, to conserve power during periods of non-use. In the preferred embodiment the chip enable terminals CE2# and CE2 are biased in an active state because they are not needed. However, if additional memory circuits are added to the system 10, the additional chip enable terminals CE2# and CE2 may be used to selectively control those additional memory circuits in a manner similar to that implemented with terminal CE#.

A processor 16 and a cache control logic (CCL) 18 provide control signals to the memory circuits 12, 14. The processor 16 may be any one of many processors, such as a Pentium® processor manufactured by Intel Corp., Santa Clara, Calif. The CCL 18 acts as an interface between the memory circuits 12, 14 and the processor 16 and is preferably an application specific integrated circuit. A clock 19 generates a clock signal (CLK) used for timing in the memory system 10. In the preferred embodiment, the processor 16 operates at approximately 133 Megahertz, while the CCL 18 and the memory circuits 12, 14 operate at approximately 66 Megahertz. A single 66 Megahertz CLK signal is generated by the clock 19, and is provided to the processor 16, the CCL 18, and the memory circuits 12, 14. The processor 16 receives the 66 Megahertz CLK signal and internally generates a 133 Megahertz signal with, for example, an internal phase-locked loop circuit.

The CCL 18 provides control signals to the memory circuits 12, 14. A byte write enable rising BWER# signal and a byte write enable falling BWEF# signal control whether data writes to the memory circuits 12, 14 are initiated at the rising edge, the falling edge, or both rising and falling edges of the CLK signal. If the BWER# signal is a low logic state, data writes are initiated at the rising edge of the CLK signal. Likewise, if the BWEF# signal is a low logic state, data writes are initiated at the falling edge of the CLK signal. If both signals BWER# and BWEF# are in a low logic state, then data writes are initiated on both the rising edge and the falling edges of the CLK signal. As a result, the present invention allows flexibility in the determining at what portion or portions of the CLK signal data is transferred, as well as allowing the data transfer frequency to be doubled over the clock frequency.

The processor 16 and the CCL 18 also produce an address status processor signal ADSP# and an address status controller signal ADSC#, respectively. Both signals ADSP#, ADSC# are address interrupt signals to indicate that a new memory location is to be addressed in one of the memory circuits 12, 14. The ADSP# and ADSC# signals also prevent all read and write accesses to the memory circuits 12, 14 until the new memory location is addressed.

The memory system 10 also includes a TAG device 20 to keep track of where in main memory the data in the cache memory came from. The TAG device 20 "tags" each address in the cache memory circuits 12, 14 with an address that the data corresponds to in the main memory 11. The TAG device 20 allows data stored and modified in the cache memory circuits 12, 14 to be rewritten back to the proper location in the main memory 11. The TAG device 20 also provides a list of the main memory 11 locations that are currently being represented in the cache memory circuits 12, 14. New entries are made, or "tagged", in the TAG device 20 whenever new data is written into the cache memory circuits 12, 14.

An external data bus 26 connects the main memory 11, the memory circuits 12, 14, the processor 16, the CCL 18, and the TAG device 20. The external data bus 26 carries data that is either written to or read from one of the memory circuits 12, 14 or the main memory 11. An external address bus 27 is also provided to the main memory 11, the memory circuits 12, 14, the processor 16, the CCL 18, and the TAG device 20. The external address bus 27 carries address signals indicative of a memory location to be written to or read from in one of the memory circuits 12, 14 or in the main memory.

Although the invention has been described in terms of a system or memory module having two memory circuits 12, 14, the present invention can be used in systems or memory modules having many more than the two memory circuits. Alternatively, the present invention may be implemented in a system with only a single memory circuit. Furthermore, the present invention may be implemented in systems other than cache memory.

Figure 2:
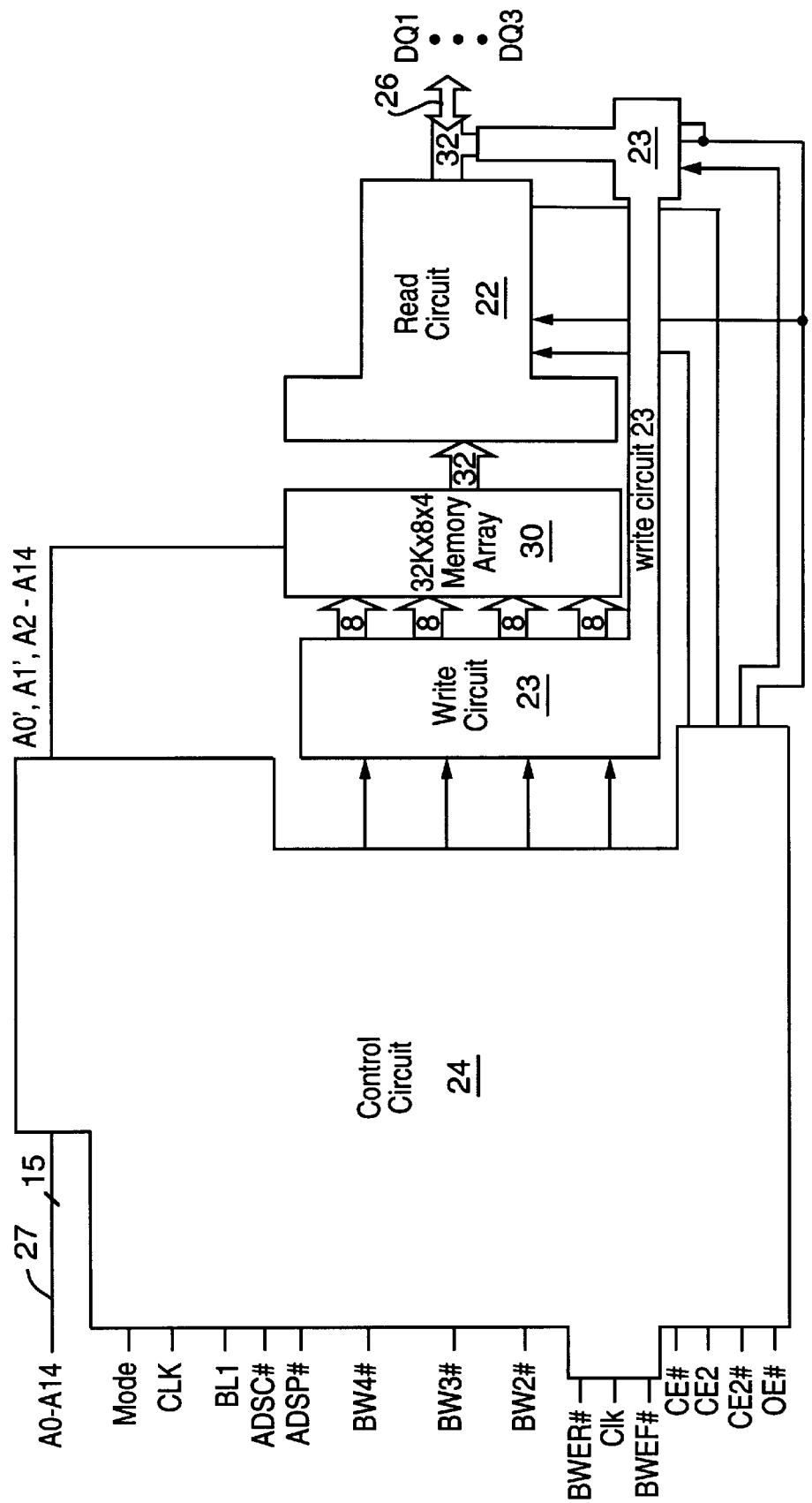
FIG. 2 is a block diagram illustrating one of the memory circuits from FIG. 1 constructed in accordance with the present invention.

FIG. 2 is a block diagram illustrating the memory circuit 12 of FIG. 1 constructed in accordance with the present invention. The memory circuit 12 is substantially identical to the memory circuit 14, and is preferably constructed as a one Meg synchronous SRAM with a 32 bit data width, formed from four eight-bit bytes. The memory circuit 12 is preferably implemented on a single integrated circuit chip, although it may also be constructed in other forms, such as from discrete components. The preferred embodiment of the present invention operates in a pipelined data manner, although the present invention may also be embodied in non-pipelined implementations. The memory circuit 12 includes a read circuit 22, a write circuit 23, a control circuit 24, and a memory array 30. The read circuit 22 produces data signals indicative of data stored in the memory array 30. The write circuit 23 receives data signals indicative of data to be written to the memory array 30 from the external data bus 26. The control circuit 24 receives control signals from the processor 16 and the CCL 18 and produces control signals for accessing the memory array 30. The memory array 30 provides primary data storage for the memory circuit 12.

Figure 3:
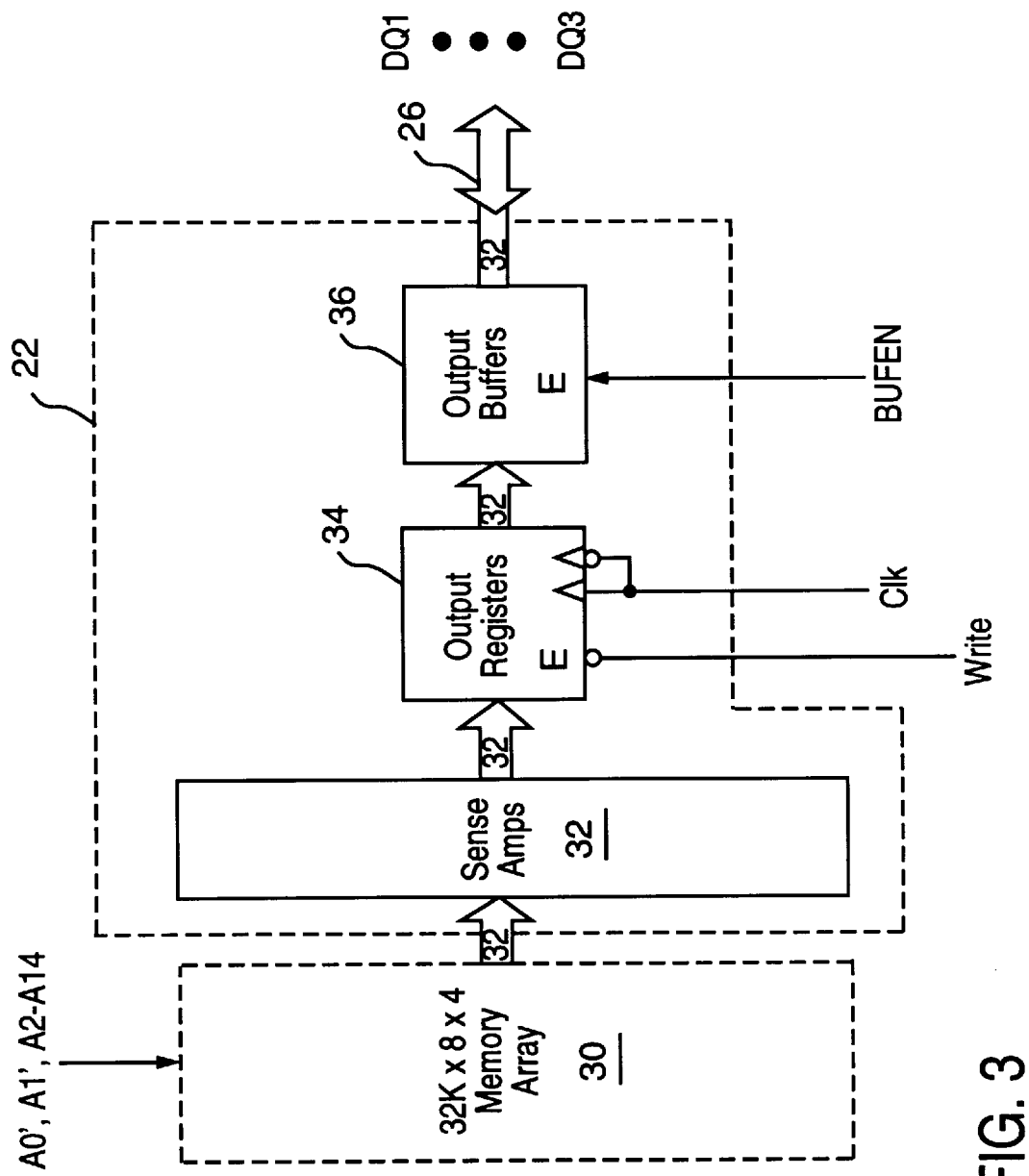
FIG. 3 is a block diagram illustrating the read circuit from FIG. 2.

FIG. 3 is a block diagram illustrating the read circuit 22 from FIG. 2. During read cycles, sense amplifiers 32 sense data stored in the memory array 30 and produce amplified signals indicative of that data. Output registers 34 latch the signals from the sense amplifiers 32 and, when the output registers 34 are enabled and receive an appropriate clock signal, provide the latched signals to output buffers 36. The output buffers 36 drive the signals on the external data bus 26. The output registers 34 are preferably used only in a pipelined implementation of the present invention, and they function in a manner that is well known in the field of pipelined information transfer. In non-pipelined implementations of the present invention the output registers 34 are preferably omitted and the output buffers 36 are in direct communication with the sense amplifiers 32.

Figure 4:
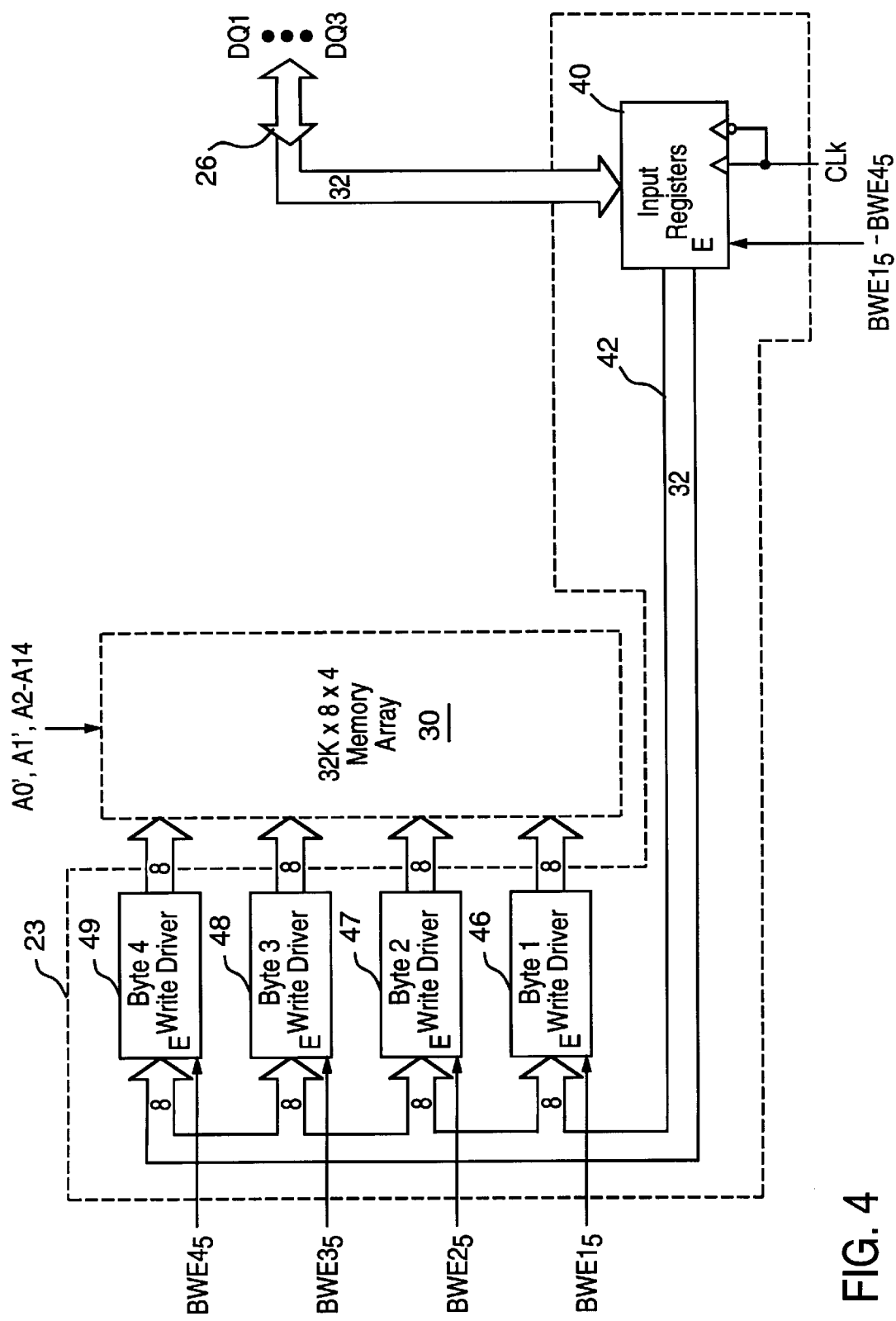
FIG. 4 is a block diagram illustrating the write circuit from FIG. 2.
Figure 5:
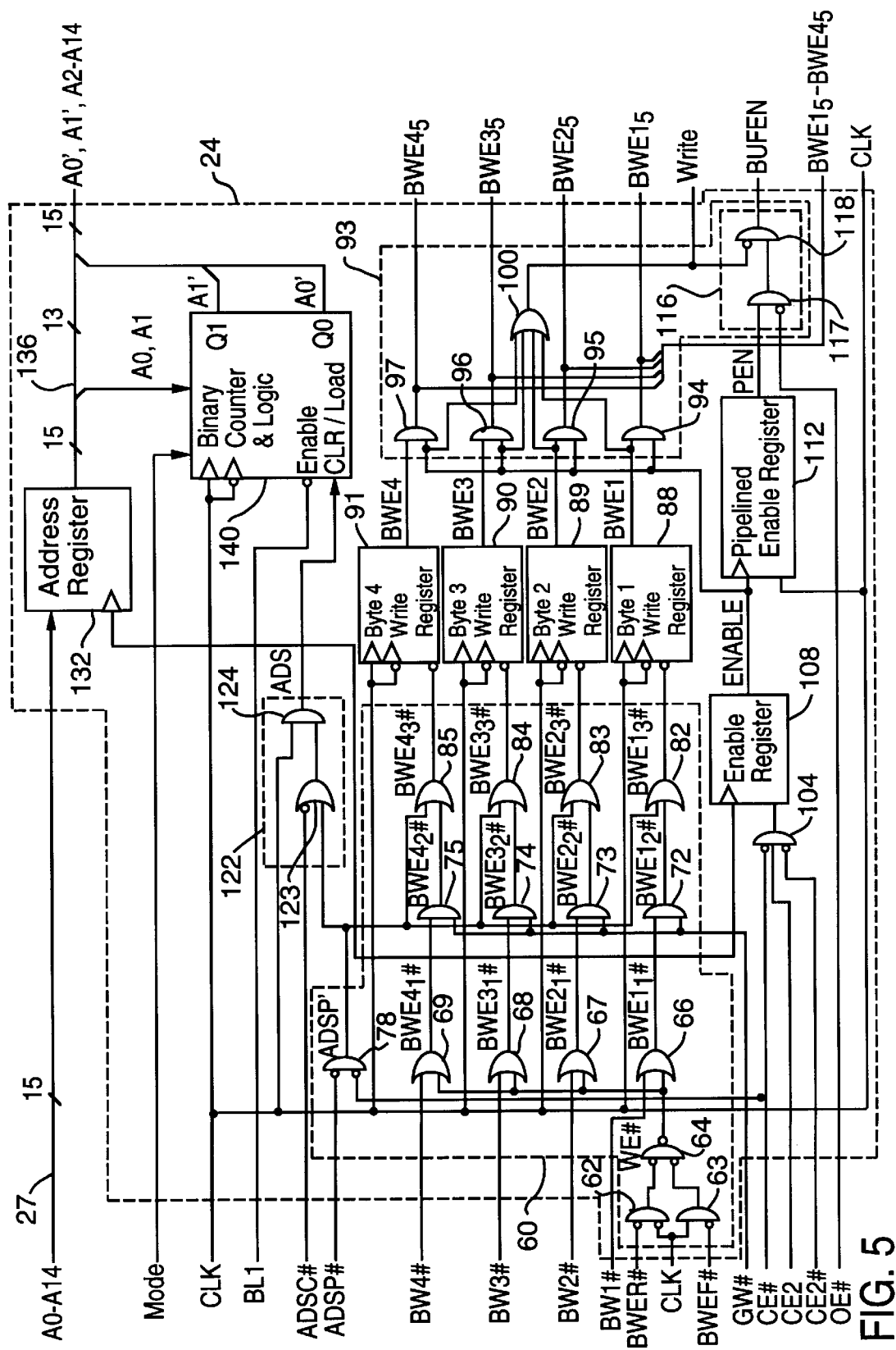
FIG. 5 is a combination block diagram and circuit schematic illustrating the control circuit from FIG. 2.

FIG. 4 is a block diagram illustrating the write circuit 23 from FIG. 2. During write cycles, data is received from the external data bus 26 and is latched by input registers 40 when the input registers 40 are enabled and receive an appropriate clock signal. The latched data is driven on the internal data bus 42 to write drivers 46, 47, 48, 49. The write drivers 46–49 receive data from the internal data bus 42 and, when enabled, drive the data for storage in the memory array 30. Preferably, there is one write driver for each byte width of the internal data bus 42. In the preferred embodiment, there are four eight-bit write drivers 46–49. FIG. 5 is a combination block diagram and circuit schematic illustrating the control circuit from FIG. 2. The control circuit 24 receives control signals from the processor 16 and the CCL 18 and produces control signals for accessing the memory array 30. Those control signals include enable signals for the output registers 34, the output buffers 36, the input registers 23, and the write drivers 46–49. The control signals also include address signals for accessing a particular location within the memory array 30.

The control circuit 24 includes a first logic circuit 60 that receives signals from the processor 16 and the CCL 18 and generates enable signals. The first logic circuit 60 includes logic gates 62, 63, 64 that logically combine signals BWER# and BWEF# with the CLK signal and produce a write enable signal WE# indicative of whether the CLK signal is in a logic state during which the memory circuit 12 is enabled to write data. For example, if signals BWER# and BWEF# are both in a low logic state, then the WE# signal will always have a low logic state, indicating that the memory circuit 12 is enabled to transmit data regardless of the logic state of the CLK signal. On the other hand, if the BWER# signal is in a high logic state and the BWEF# signal is in a low logic state, then the WE# signal will have a low logic state only when the CLK signal is in a high logic state, indicating that the memory circuit 12 is only enabled to write data when the CLK signal is in a high logic state. The opposite is true if the logic states of the BWER# and BWEF# signals are reversed, in which case the memory circuit 12 is only enabled to write data when the CLK signal is in a low state.

Byte write signals BW1#, BW2#, BW3#, BW4# are received from the CCL 18 and indicate which of the write drivers 46–49, if any, are to be enabled to write data to the memory array 30. OR gates 66, 67, 68, 69 logically combine each of the byte write signals BW1#–BW4# with the WE# signal to produce byte write enable signals $BWE1_1\#$, $BWE2_1\#$, $BWE3_1\#$, $BWE4_1\#$ corresponding to each write driver 46–49, respectively.

A global write signal GW# is received from the CCL 18 and will cause all of the write drivers 46–49 to be enabled to write data to the memory array 30, even if they were not selected by the byte write signals BW1#–BW4#. AND gates 72, 73, 74, 75 logically combine each of the $BWE1_1\#$–$BWE4_1\#$ signals with the GW# signal and produce a second set of byte write enable signals $BWE1_2\#$, $BWE2_2\#$, $BWE3_2\#$, $BWE4_2\#$ indicative of whether each write driver 46–49 is enabled to write data to the data array 30 in light of the GW# signal.

Alternatively, the global write feature may be implemented in a manner similar to that used to produce the write enable signal WE#, described hereinabove. In that case, global write enable signals GWER#, GWEF# are provided to initiate global writes on rising and falling edges, respectively, of the clock signal CLK. Logic gates, similar to the logic gates 62–64 used to generate the WE# signal, combine signals GWER# and GWEF# to produce the GW# signal. Although that implementation would permit easy control of data during any data slot, it is not preferred because it does not easily fit into a 100-pin thin quad flat package, which has become the industry standard for the type of SRAMs that form the preferred embodiment of the present invention. Conversely, the present invention may also be implemented without the global write feature. In that embodiment, the AND gates 72–75 may be eliminated and the output terminals of the OR gates 66–69 may be connected where the output terminals of the AND gates 72–75 are connected. In an alternative embodiment, the Global Write signal GW# could also be conditioned by the BWER# and BWEF# style conditioning circuitry, i.e. GW# would be superseded by GWER# and GWEF# to permit easy control of data during any possible data slot. The preferred embodiment does not include this option because it does not easily fit into the 100-pin thin quad flat package which has become the industry standard for SRAMs similar to this.

An AND gate 78 logically combines the ADSP# signal and the CE# signal to produce a modified address status processor signal ADSP' indicative of whether a processor interrupt is intended for the memory circuit 12. In order for the memory circuit to recognize a processor interrupt, the ADSP# signal must be in a low logic state and the memory device 12 must be enabled, as indicated by the CE# signal being in a low logic state. When a processor interrupt is recognized, the ADSP' signal is produced in a high logic state by the AND gate 78.

OR gates 82, 83, 84, 85 logically combine the modified byte write enable signals $BWE1_2\#$–$BWE4_2\#$ with the modified address status processor signal ADSP' to produce further modified byte write enable signals $BWE1_3\#$, $BWE2_3\#$, $BWE3_3\#$, $BWE4_3\#$ indicative of whether the write drivers 46–49 are to be enabled in light of the ADSP' signal. The $BWE1_3\#$–$BWE4_3\#$ signals are the same as the BWE1$_2$#–BWE4$_2$# signals unless a processor interrupt is indicated by the ADSP' signal, in which case all of the write drivers are disabled until the interrupt ends and a new location is addressed in the memory array 30.

The control circuit 24 also includes four write registers 88, 89, 90, 91, with one corresponding to each of the write drivers 46–49, respectively. Upon receipt of an appropriate CLK signal, the write registers 88–91 latch the BWE1$_3$#–BWE4$_3$# signals and produce output signals BWE1$_4$–BWE4$_4$. The output signals BWE1$_4$–BWE4$_4$ have a logic state opposite to the BWE1$_3$#–BWE4$_3$# signals received by the write registers 88–91.

A second logic circuit 93 receives the BWE1$_4$–BWE4$_4$ signals and generates enable signals for the write drivers 46–49, the output registers 34, and the output buffers 36. The second logic circuit 93 includes AND gates 94, 95, 96, 97 that logically combine each of the signals BWE1$_4$–BWE4$_4$ from the write registers 88–91 with an ENABLE signal to produce signals BWE1$_5$, BWE2$_5$, BWE3$_5$, BWE4$_5$ used to enable the write drivers 46–49. The ENABLE signal is indicative of whether the memory circuit 12 is enabled, and is discussed in more detail below. One or more of the write drivers will only be enabled if the ENABLE signal is in a high logic state and if the output from one or more of the write registers 88–91 is in a high logic state.

The second logic circuit 93 also includes an OR gate 100 that logically combines all of the signals from the write registers 88–91 to produce signal WRITE indicative of whether the memory circuit 12 is in a write mode. If one or more of the write registers 88–91 is producing a high logic signal, indicating that one or more of the write drivers 46–49 is selected to write to the memory array 30, then the memory circuit 12 is determined to be in the write mode and the WRITE signal is produced in a high logic state. Conversely, if the memory circuit 12 is not in a write state, then the WRITE signal is produced in a low logic state. Signal WRITE is provided to an input terminal of the output registers 34 and enables the output registers 34 when the WRITE signal is in a low logic state.

An AND gate 104 logically combines the chip enable signals CE#, CE2, CE2# and produces an output signal indicative of whether all of those signals are in their active states, thereby indicative of whether the memory circuit 12 is enabled.

An enable register 108 is responsive to the output of the AND gate 104 and to an ADS signal. The ADS signal is indicative of whether an address interrupt signal has been received from either the processor 16 or the CCL 18, and is described in more detail below. The enable register 108 produces the ENABLE signal, which is used by AND gates 94–97 and is indicative of whether the memory circuit 12 is enabled. The enable register 108 produces the ENABLE signal by latching the output of the AND gate 104 each time the memory circuit 12 receives an address interrupt signal, as indicated by the ADS signal.

A pipelined enable register 112 latches the ENABLE signal and produces a pipelined enable signal PEN, having the same logic state as the ENABLE signal, at the rising edge of the CLK signal.

The PEN signal is an input for an output buffer enable circuit 116 included in the second logic circuit 93. The output buffer enable circuit 116 is responsive to the WRITE signal, the OE# signal, and the PEN signal, and produces an output buffer enable signal BUFEN that is provided to an enable terminal of the output buffers 36. The output buffer enable circuit 116 includes a first AND gate 117 and a second AND gate 118. The BUFEN signal is produced in a high logic state to enable the output buffers 36 when the WRITE signal is in a low logic state, indicating that the memory circuit 12 is in a read mode, when the PEN signal is in a high logic state, indicating that all of the chip enable signals CE#, CE2, CE2# are in their active states, and when the OE# signal is in a low logic state, indicating that the CCL 18 has enabled the memory circuit 12 to produce an output signal on the external data bus 26.

The control circuit 24 also includes an address status circuit 122, having an OR gate 123 and an AND gate 124, responsive to the ADSC# and ADSP' signals, and producing the address status signal ADS used by the enable register 108. The ADS signal is indicative of whether either the processor 16 or the CCL 18 has requested that the memory circuit 12 address a new location within the memory array 30. If a new location within the memory array 30 is requested, the address of the new location will be provided on the external address bus 27.

An address register 132 latches address signals A0–A14 on the external address bus 27 whenever the ADS signal is in high logic state, indicating that an address status signal has been received. The address register 132 drives the latched signals on an internal address bus 136.

In the preferred embodiment a binary counter & logic circuit 140 intercepts the two least significant address bits A0, A1 and produces two new address bits A0', A1' in their place. A total of four address locations may be generated by the binary counter & logic circuit 140 for each address transmitted over the external address bus 27. The reason that the two least significant bits A0, A1 are controlled is because in the preferred embodiment the data bus width of the memory circuit 12 is thirty-two bits, or four bytes. The cache line width, and the logical data bus width of the processor 16 used in the preferred embodiment, is 256 bits, or thirty-two bytes. Therefore, an entire cache line is read into or out of the parallel memory circuits 12, 14 with a burst sequence of four from the binary counter and logic circuit 140. Of course, either more or less bits may be controlled by the binary counter & logic circuit 140 depending on the circumstances of the particular application. The new address bits A0', A1' are provided, along with the other address bits A2–A14, to the memory array 30. The operation of the binary counter & logic circuit 140 is controlled by a burst length one signal BL1 provided from the CCL 18. When the BL1 signal is in a low logic state the binary counter & logic circuit 140 is in burst mode and it cycles the A0', A1' bits through all four possible combinations. When the BL1 signal is in a high logic state the binary counter & logic circuit 140 is not in burst mode and the A0' and A1' bits remain in the same state as the A0 and A1 bits. A MODE signal is provided by the CCL 18 and determines whether the binary counter & logic circuit operates in interleaved burst mode or a linear burst mode. In linear burst mode, the binary counter & logic circuit 140 acts as a binary counter, beginning with the address signals A0, A1 provided over the external address bus 128, incrementing the address signals A0', A1', and wrapping around to zeros in the event of an overflow (ie. when an increment occurs with both A0 and A1 having logic values of one). In interleaved mode, the binary counter & logic circuit 140 uses the following formula for counting:

start value: A1' A0' next value: A1' A0'# next value: A1'# A0' next value: A1'# A0'#.

Of course, the memory circuit 12 may be constructed without the binary counter & logic circuit 140 so that each new address is externally generated and provided over the external address bus 128. Furthermore, if the binary counter & logic circuit 140 is used, it may include more or less bits than used in the preferred embodiment.

Within the memory circuit 12 there are several components, such as the output registers 34, the output buffers 36, the input registers 40, the write drivers 44–49, the write registers 88–91, and the binary counter & logic circuit 140, that include complementary clock input terminals, one inverted and one non-inverted. The complementary clock input terminals allow the components to trigger on both the rising edge of the CLK signal and the falling edge of the CLK signal, allowing the components to operate twice during each cycle of the CLK signal. Preferably, however, those components also require an additional signal for operation, such as an enable signal, and will not operate at twice the frequency of the clock signal unless they are enabled at both the rising and falling edges of the CLK signal. As discussed above, the enable signals for the output register 36 and the input register 40 are indirectly controlled by the BWER# and BWEF# signals, provided by the CCL 18. The write registers 88–91 are indirectly controlled by the BWER# and BWEF# signals through the BWE1$_3$#–BWE4$_3$# signals. The binary counter & logic circuit 140 is controlled by the BL1 signal from the CCL 18. Other control schemes may also be used to allow the components in the memory circuit 12 to trigger at different portions of the CLK signal.

FIGS. 6a through 6m are timing diagrams illustrating signals within the memory system 10 during back to back read cycles. FIG. 6a illustrates a typical clock signal used with synchronous memory devices. The clock signal is periodic and has rising edges and falling edges. FIG. 6b illustrates when output data is registered in the output registers 34. The output data is registered twice per periodic cycle of the clock signal, once at the rising edge of the clock cycle and once at the falling edge of the clock cycle. FIG. 6c illustrates the address signals used to select the groups of output data for each read cycle. In the preferred embodiment, addresses are latched during rising edges of the clock signal.

FIG. 6d illustrates the output data driven on the external data bus 26 by the output buffers 36. The output data is driven on the external data bus 26 about every one half clock cycle after the output data is registered. The delay in driving the output data onto the external data bus 26 is caused by the output registers 34. As discussed above, the present invention may be implemented without the output registers 34 so that the delay may be eliminated and the output data is driven onto the external data bus 26 within one half cycle of an address location being selected in the memory array 30. Regardless of whether the output register 34 is used, the output data is driven onto the external data bus 26 at twice the frequency of the CLK signal. FIG. 6d illustrates two sets of output data $Q1_1$, $Q1_2$, $Q1_3$, $Q1_4$ and $Q2_1$, $Q2_2$, $Q2_3$, $Q2_4$. The reason that each set of output data has a length of four is because the memory circuit 12 is operating in burst mode, and burst mode in the preferred embodiment has a length of four. As discussed above, the burst mode is controlled by the BL1 signal, illustrated in FIG. 6e. The BL1 signal is ignored when the first output data $Q1_1$ is registered, because at least a first output data will always be produced regardless of the burst length. The logic state of the BL1 signal is relevant, however, in determining whether subsequent output data are registered. In FIG. 6e the BL1 signal is in a low logic state when output data $Q1_2$, $Q1_3$, and $Q1_4$ are registered, indicating that a full burst length, as opposed to a single output data burst, is to be produced. As a result, the binary counter and logic circuit 140 operates in burst mode and increments the memory addresses A0' and A1' at each edge of the CLK signal, producing output data in groups of four. As a result, output data $Q1_2$, $Q1_3$, $Q1_4$ are produced, as illustrated in FIG. 6d. Likewise, the BL1 signal is ignored when the first output data $Q2_1$ is produced for the second read cycle. As subsequent output data $Q2_2$, $Q2_3$, $Q2_4$ are produced, however, the logic state of the BL1 signal is once again relevant and output data $Q2_2$, $Q2_3$, $Q2_4$ are produced.

FIG. 6f illustrates the OE# signal. As discussed above, the OE# signal is an active low signal that is used to enable the output buffers 36. The output enable signal must be, and is, in a low logic state in order for output data to be produced on the external data bus 26. FIGS. 6g and 6h illustrate the ADSP# and ADSC# signals, respectively. As discussed above, those signals are interrupt signals provided by the processor 16 and the CCL 18, respectively, to indicate that a new memory location is to be addressed in the memory circuit 12. At least one those signals must be low when the address data A1, A2 is supplied.

FIG. 6i illustrates the BW1#–BW4# signals. Because the present example illustrates read cycles, the BW1#–BW4# signals are all in a high logic state. FIG. 6j illustrates the GW# signal. As with the BW1#–4# signals in FIG. 6i, the GW# signal must also be high because the present example illustrates read cycles. FIGS. 6k and 6l illustrate the BWER# and BWEF# signals, respectively. As discussed above, those signals determine whether the memory circuit 12 writes data to the memory array 30 during the rising edge, falling edge, or both the rising and falling edges of the CLK signal. Because the present example illustrates read cycles, the WER and BWEF signals are both high, indicating that the memory circuit 12 does not write to the memory array 30 at all. FIG. 6m illustrates the CE# signal. The CE# signal is active low and, therefore, is in a low logic state to enable the memory circuit 12.

FIGS. 7a through 7m are timing diagrams illustrating signals within the memory system 10 during back to back write cycles initiated by the ADSP# signal. FIG. 7a illustrates the CLK signal. FIG. 7b illustrates that the input data is registered by the input registers 40 during both the rising and falling edges of the CLK signal. FIG. 7c illustrates address data A1, A2 registered from the external address bus 128 by the address register 132. There is a full CLK cycle delay between the time when the address data A1, A2 are registered and the time when the first input data $D1_1$, $D2_1$, respectively, are registered and written. The reason for the delay is that the data is not written until a "tag compare" is performed. A "tag compare" is a function that determines whether the selected cache address is the address desired by the write operation. Uncertainty regarding the identity of cache addresses is common in cache memory systems because when data is copied from main memory 11 into cache memory circuits 12, 14, the cache address is different than the main memory address. As described hereinabove, one function of the TAG device 20 is to cross-reference the cache addresses with the main memory addresses. The "tag compare" function utilizes that cross reference to determine whether selected cache address is the desired address. A tag compare might not be reliably performed within one half CLK cycle when the ADSP# signal initiates a write cycle. As a result, and in order to ensure that the desired data is in the proper location for overwriting, an additional one half CLK cycle delay is inserted whenever the ADSP# signal initiates a write cycle.

FIG. 7d illustrates data present on the external data bus 38. As illustrated by FIGS. 7b and 7d, input data $D1_{1-4}$, $D2_{1-4}$ is registered on both the rising edges and the falling edges of the CLK signal and is written by the write drivers 46–49 to the memory array 30 during the same half clock cycle that the data $D1_{1-4}$, $D2_{1-4}$ is registered by the input registers 40. As discussed above with respect to FIG. 6d, the data $D1_{1-4}$, $D2_{1-4}$ is organized into two sets of four because the circuit 12 is operating in burst mode. FIG. 7e illustrates the BL1 signal. As discussed above with respect to FIG. 6e, the BL1 signal is ignored when the first input data $D1_1$ and $D2_1$ are registered, but is relevant in order for subsequent input data to be registered during burst mode. FIG. 7f illustrates the OE# signal. Because the present example is a read cycle, the OE# signal is high to disable the output buffers 36. FIG. 7g illustrates the ADSP# signal. As discussed above, the ADSP# signal is an interrupt signal generated by the processor 16 to indicate that a new memory location is to be addressed in the memory array 30. The ADSP# signal is held high while the memory system 10 is in burst mode, until a new address A2 is needed for a subsequent write cycle.

FIG. 7h illustrates the ADSC# signal. As discussed above, the ADSC# signal is an interrupt signal provided by the CCL 18. In the present example, the ADSC# signal is not used to initiate a write cycle, so it is always in a high logic state. FIG. 7i illustrates the BW1#–BW4# signals. One or more of the BW1#–BW4# signals is in a low logic state when data, illustrated in FIG. 7d, is written to the memory array 30. FIG. 7j illustrates the GW# signal. The global write feature is not utilized in the present example, so the GW# signal is always in a high logic state. FIGS. 7k and 7l illustrate the BWER# and BWEF# signals, respectively. Those signals are ignored until the write drivers 46–49 are to write data to the memory array 30. As illustrated in FIG. 7k, the BWER# signal is in a low logic state when the first input data $D1_1$ is to be written during a rising edge of the CLK signal. Likewise, FIG. 7l illustrates that the BWEF# signal is in a low logic state when the input data $D1_2$ is to be written during a falling edge of the CLK signal. Those signals stay in their respective low logic states until the last input data is written to the memory array 30 during the rising and falling edges of the CLK signal, respectively. FIG. 7m illustrates the CE# signal. The CE# signal is in a low logic state to enable the memory circuit 12.

FIGS. 8a through 8m are timing diagrams illustrating signals within the memory system 10 during back to back write cycles initiated by the ADSC# signal. FIGS. 8a through 8m are analogous to FIGS. 7a through 7m, with the exceptions discussed below. Write cycles initiated by the CCL 18, via the ADSC# signal, unlike write cycles initiated by the processor 16, via the ADSP# signal, register and write input data during the same half CLK signal cycle that address signals A1, A2 are registered by the memory circuit 12. The reason for that difference is that the condition of the data at the desired memory location is known when the CCL 18 writes data, and therefore does not need to be verified. Since there are not any conditions that need to be verified, the data can be written as soon as the data and the address signals are registered.

FIGS. 9a through 9m are timing diagrams illustrating signals within the memory system 10 during a read-write cycle initiated by the ADSP# signal. The signals illustrated in FIGS. 9a through 9m are analogous to the signals in FIGS. 6a–6m, 7a–7m, and 8a–8m.

The present invention also includes a method for reading and writing data to and from the memory circuit 12. The method may be illustrated with reference to FIGS. 6a–6m, 7a–7m, 8a–8m, and 9a–9m. The method includes the steps of either reading or writing data during a rising edge of the CLK signal, followed by either reading or writing data during the following falling edge of the CLK signal, as illustrated in FIGS. 6d, 7d, 8d, and 9d. Similarly, data may be either read or written during consecutive falling and rising edges of the CLK signal. Although most consecutive data transmissions will likely involve the same function, either reading or writing, as illustrated in FIGS. 6d, 7d, and 8d, the method of the present invention also includes performing one read and one write function, in either order, on consecutive edges of the CLK signal, as illustrated in FIG. 9d. In other words, the present invention not only includes performing a plurality of read functions on consecutive edges of the CLK signal and a plurality of write functions on consecutive edges of the CLK signal, but also includes performing read-write functions and write-read functions on consecutive edges of the CLK signal.

In the preferred embodiment, the method of the present invention for reading data includes the following steps. First, a CLK signal having a rising edge and a falling edge is generated. The CLK signal is typically supplied externally, and is not an integral part of a memory circuit 12, 14. A data signal indicative of data stored at a memory location within the memory array 30 is sensed, such as with sense amplifiers 32. The memory location within the memory array 30 is selected with address signals. The address signals are typically generated by the processor 16 or the CCL 18, and the address register 132 and the binary counter & logic circuit 140 provide the address signals to the memory array 30. The data signal is latched at the rising edge of the CLK signal by output registers 34. The data signal may, of course, also be latched at the falling edge of the CLK signal. The latched data signal is produced at a terminal, such as the external data bus 26, for use by other components, such as the processor 16, the CCL, or the main memory 11. In a pipelined embodiment of the present invention, the data signal is also passed through output registers 34 before being produced at the terminal. Subsequent read functions may be performed during subsequent edges of the CLK signal in the same manner as described above, so that two read function may be performed during each CLK cycle.

The method of the present invention for writing data includes the following steps. First, a clock signal having a rising edge and a falling edge is generated. As stated above, the CLK signal is typically not generated by the memory circuit 12, 14. A data signal to be written to a memory location in the memory array 30 is latched on the rising edge of the clock signal. Also as stated above, the memory location is selected with address signal, which are typically generated by the processor 16 or the CCL 18. The address register 132 and the binary counter & logic circuit 140 provide the address signals to the memory array 30. The data signal to be written to the memory array is typically provided by the processor 16 or the CCL 18 via the external data bus 26. The data signal is latched by input registers 40. The data signal may be latched on either the rising edge or the falling edge of the CLK signal. The latched data signal is then written to the selected memory location by the write drivers 46–49. Subsequent write functions may be performed during subsequent edges of the CLK signal in the same manner as described above, so that two write functions may be performed during each CLK cycle. Furthermore, write functions followed by read functions on the next edge of the CLK signal, and vice versa, may also be performed, so that both a read function and a write function may be performed on the memory array 30 during each clock cycle.

Those of ordinary skill in the art will recognize that many modifications and variations of the present invention may be implemented. The foregoing description and the following claims are intended to cover all such modifications and variations.

What is claimed is:

1. A synchronous memory circuit, comprising:

a memory array;

a control circuit responsive to a clock signal having a clock cycle including first and second consecutive edges, said control circuit for generating control signals for accessing said memory array for a read operation at the first edge of the clock cycle and for accessing said memory array for a write operation at the second edge of the clock cycle;

a read circuit responsive to the control signals for generating read data signals indicative of data stored in said memory array; and a write circuit responsive to the control signals for storing data in said memory array.

2. The synchronous memory circuit of claim 1, wherein said control circuit is responsive to both a first and a second signal indicative of whether said memory array is to be accessed on the first edge and the second edge, respectively, of the clock cycle.

3. The synchronous memory circuit of claim 1, wherein said read circuit generates signals indicative of data stored in said memory array on the first edge and the second edge of the clock cycle.

4. The synchronous memory circuit of claim 1, wherein said write circuit stores data in said memory array on the first edge and the second edge of the clock cycle.

5. A synchronous memory circuit, comprising:

a memory array;

a control circuit responsive to a clock signal having a clock cycle including first and second consecutive edges, said control circuit for generating control signals for accessing said memory array for a read operation at the first edge of the clock cycle and for accessing said memory array for a write operation at the second edge of the clock cycle;

a sense amplifier responsive to said memory array for generating read data signals indicative of data stored in said memory array;

an output buffer responsive to the control signals generated by said control circuit and for driving the read data signals generated by said sense amplifier;

an input register responsive to the control signals generated by said control circuit and for driving externally-supplied write data signals; and a write driver responsive to the control signals generated by said control circuit and for driving the write data signals from said input register to said memory array.

6. The synchronous memory circuit of claim 5, wherein said control circuit is responsive to a first and a second signal indicative of whether said memory array is to be accessed during the first edge and the second edge, respectively, of the clock cycle.

7. The synchronous memory circuit of claim 5, wherein said control circuit includes:

a first logic circuit responsive to externally-supplied signals for generating a write enable signal indicative of whether said write driver is selected to drive the write data signals to said memory array;

a write register responsive to the clock signal and for driving the write enable signal on the first edge and the second edge of the clock cycle;

an enable register responsive to a chip enable signal and the clock signal and for generating an enable signal indicative of whether the synchronous memory circuit is enabled; and a second logic circuit responsive to the write enable signal from said write register and responsive to the enable signal from said enable register, for generating a first control signal for enabling said write driver.

8. The synchronous memory circuit of claim 7, wherein said second logic circuit generates a second control signal for enabling said output buffer.

9. The synchronous memory circuit of claim 7, wherein said control circuit further comprises an address register responsive to an address signal and for generating a third control signal for selecting a memory location in said memory array.

10. The synchronous memory circuit of claim 5, further comprising an output register responsive to the control signals generated by said control circuit and for driving the read data signals from said sense amplifier to said output buffer.

11. The synchronous memory circuit of claim 10, wherein said output register is responsive to the first edge and the second edge of the clock cycle.

12. A synchronous cache memory system, comprising:

a first memory circuit in communication with a clock signal having a clock cycle including first and second consecutive edges, said first memory circuit for reading data at the first edge of the clock cycle and for writing data at the second edge of the clock cycle;

a processor for generating control signals for accessing said first memory circuit;

a TAG device for monitoring data written to said first memory circuit; and a cache control logic circuit responsive to said processor and in communication with said TAG device and said first memory circuit, said cache control logic circuit for generating control signals for accessing said first memory circuit at the first edge and the second edge of the clock cycle.

13. The synchronous cache memory system of claim 12, wherein said cache control logic circuit is for generating control signals for accessing said memory circuit at both the first edge and the second edge of the clock cycle.

14. The synchronous cache memory system of claim 12, further comprising:

a plurality of memory circuits in communication with the clock signal, said plurality of memory circuits for reading data at one of the first edge of the clock cycle and for writing data at the second edge of the clock cycle.

15. The synchronous cache memory system of claim 14, wherein:

said processor is for generating control signals for accessing said plurality of memory circuits;

said TAG device is for monitoring data written to said plurality of memory circuits; and said cache control logic circuit is responsive to said processor and is in communication with said TAG device and said plurality of memory circuits, said cache control logic circuit for generating control signals for accessing said plurality of memory circuits at the first edge and the second edge of the clock cycle.

16. A method of reading data and storing data in a memory circuit, comprising the steps of:

generating a clock signal having first and second consecutive edges;

sensing a first data signal indicative of data stored in the memory array;

latching the first data signal at the first edge of the clock signal;

providing the latched first data signal at an output terminal;

latching a second data signal at the second edge of the clock signal; and storing the second data signal in the memory array.

17. The method of claim 16, wherein said step of generating a clock signal includes the step of generating a clock signal having a rising first edge and a falling second edge.

18. The method of claim 16, wherein said step of generating a clock signal includes the step of generating a clock signal having a falling first edge and a rising second edge.

19. The synchronous memory circuit of claim 1, wherein the first edge of the clock cycle is a rising edge and the second edge of the clock cycle is a falling edge.

20. The synchronous memory circuit of claim 1, wherein the first edge of the clock cycle is a falling edge and the second edge of the clock cycle is a rising edge.

21. The synchronous memory circuit of claim 1, wherein said control circuit generates a control signal for accessing said memory array for a read operation at an edge of the clock signal immediately prior the first edge.

22. The synchronous memory circuit of claim 1, wherein said control circuit generates a control signal for accessing said memory array for a write operation at an edge of the clock signal immediately subsequent the second edge.

23. The synchronous memory circuit of claim 5, wherein the first edge of the clock cycle is a rising edge and the second edge of the clock cycle is a falling edge.

24. The synchronous memory circuit of claim 5, wherein the first edge of the clock cycle is a falling edge and the second edge of the clock cycle is a rising edge.

25. The synchronous memory circuit of claim 9, wherein said control circuit generates a control signal for accessing said memory array for a read operation at an edge of the clock signal immediately prior the first edge.

26. The synchronous memory circuit of claim 5, wherein said control circuit generates a control signal for accessing said memory array for a write operation at an edge of the clock signal immediately subsequent the second edge.

27. The synchronous cache memory system of claim 12, wherein the first edge of the clock cycle is a rising edge and the second edge of the clock cycle is a falling edge.

28. The synchronous cache memory system of claim 12, wherein the first edge of the clock cycle is a falling edge and the second edge of the clock cycle is a rising edge.

29. The synchronous cache memory system of claim 12, wherein said memory circuit generates a control signal for accessing said memory array for a read operation at an edge of the clock signal immediately prior the first edge.

30. The synchronous cache memory system of claim 12, wherein said memory circuit generates a control signal for accessing said memory array for a write operation at an edge of the clock signal immediately subsequent the second edge.

* * * * *